(12) United States Patent
Hsu et al.

(10) Patent No.: US 11,108,131 B2
(45) Date of Patent: Aug. 31, 2021

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Shao-En Hsu, Kaohsiung (TW); Huei-Shyong Cho, Kaohsiung (TW); Shih-Wen Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 77 days.

(21) Appl. No.: 16/538,592

(22) Filed: Aug. 12, 2019

(65) Prior Publication Data
US 2021/0050649 A1 Feb. 18, 2021

(51) Int. Cl.
H01Q 1/22 (2006.01)
H01Q 9/04 (2006.01)
H01Q 1/38 (2006.01)
H01L 23/66 (2006.01)
H01L 23/31 (2006.01)

(52) U.S. Cl.
CPC ....... H01Q 1/2283 (2013.01); H01L 23/3121 (2013.01); H01L 23/66 (2013.01); H01Q 1/38 (2013.01); H01Q 9/0407 (2013.01); H01L 2223/6677 (2013.01)

(58) Field of Classification Search
None
See application file for complete search history.

(56) References Cited

U.S. PATENT DOCUMENTS 8,354,972 B2  1/2013 Borja et al.
2020/0106158 A1* 4/2020 Gomez Angulo ..... H01Q 1/521

* cited by examiner

Primary Examiner — William A Harriston
(74) Attorney, Agent, or Firm — Foley & Lardner LLP

(57) ABSTRACT

A semiconductor device package includes a substrate, a first antenna and a second antenna. The substrate has a first surface and a second surface opposite to the first surface. The first antenna pattern is disposed over the first surface of the substrate. The first antenna pattern has a first bandwidth. The first antenna pattern has a first port configured to generate a magnetic field. The second antenna pattern is disposed over the first surface of the substrate. The second antenna pattern has a second bandwidth different from the first bandwidth. A prolonged line of an edge of the first antenna pattern parallel to the magnetic field generated by the first port of the first antenna pattern is spaced apart from the second antenna pattern.

28 Claims, 8 Drawing Sheets

SEMICONDUCTOR DEVICE PACKAGE AND METHOD OF MANUFACTURING THE SAME

BACKGROUND

1. Technical Field

The present disclosure relates to a semiconductor device package and a method of manufacturing the same, and to a semiconductor device package including an antenna and a method of manufacturing the same.

2. Description of the Related Art

Wireless communication devices, such as cell phones, typically include antennas for transmitting and receiving radio frequency (RF) signals. In recent years, with the continuous development of mobile communication and the pressing demand for high data rate and stable communication quality, relatively high frequency wireless transmission (e.g., 28 GHz or 60 GHz) has become one of the most important topics in the mobile communication industry. However, signal attenuation and interference are some of the problems at relatively high frequency (or relatively short wavelength) wireless transmission.

SUMMARY

In accordance with some embodiments of the present disclosure, a semiconductor device package includes a substrate, a first antenna and a second antenna. The substrate has a first surface and a second surface opposite to the first surface. The first antenna pattern is disposed over the first surface of the substrate. The first antenna pattern has a first bandwidth. The first antenna pattern has a first port configured to generate a magnetic field. The second antenna pattern is disposed over the first surface of the substrate. The second antenna pattern has a second bandwidth different from the first bandwidth. A prolonged line of an edge of the first antenna pattern parallel to the magnetic field generated by the first port of the first antenna pattern is spaced apart from the second antenna pattern.

In accordance with some embodiments of the present disclosure, a semiconductor device package includes a substrate, a first antenna and a second antenna. The substrate has a first surface and a second surface opposite to the first surface. The first antenna pattern is disposed over the first surface of the substrate. The first antenna pattern has a first port configured to generate a magnetic field. The second antenna pattern is disposed over the first surface of the substrate. The first antenna pattern and the second antenna pattern are arranged on a same plane. The projection of a lateral surface of the first antenna pattern adjacent to the first port is spaced apart from the second antenna pattern.

Figure 1A:
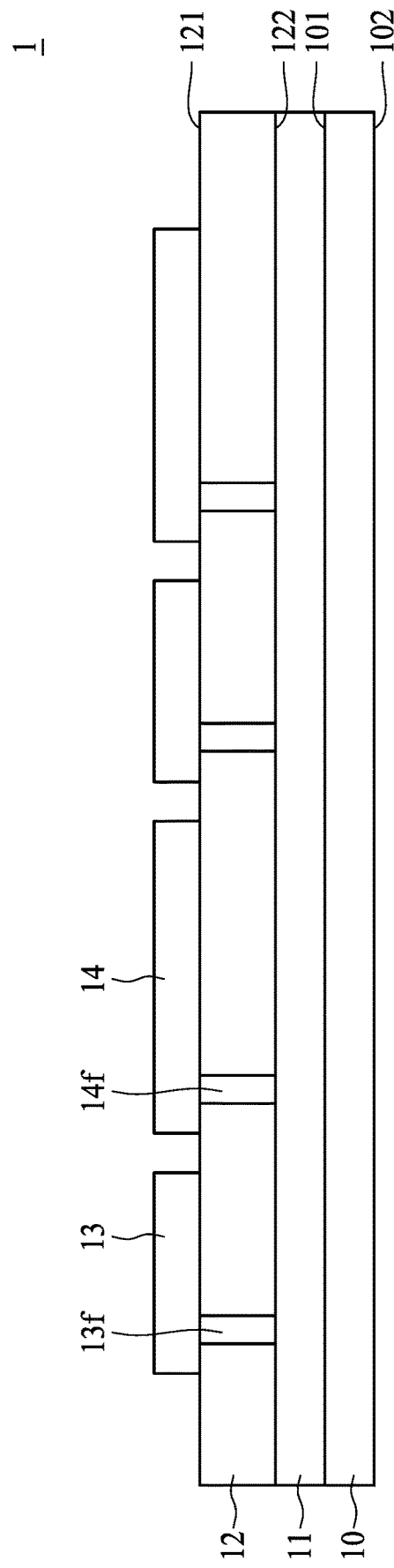
FIG. 1A illustrates a cross-sectional view of a semiconductor device package in accordance with some embodiments of the present disclosure.

Common reference numerals are used throughout the drawings and the detailed description to indicate the same or similar components. The present disclosure will be readily understood from the following detailed description taken in conjunction with the accompanying drawings.

DETAILED DESCRIPTION

Figure 1B:
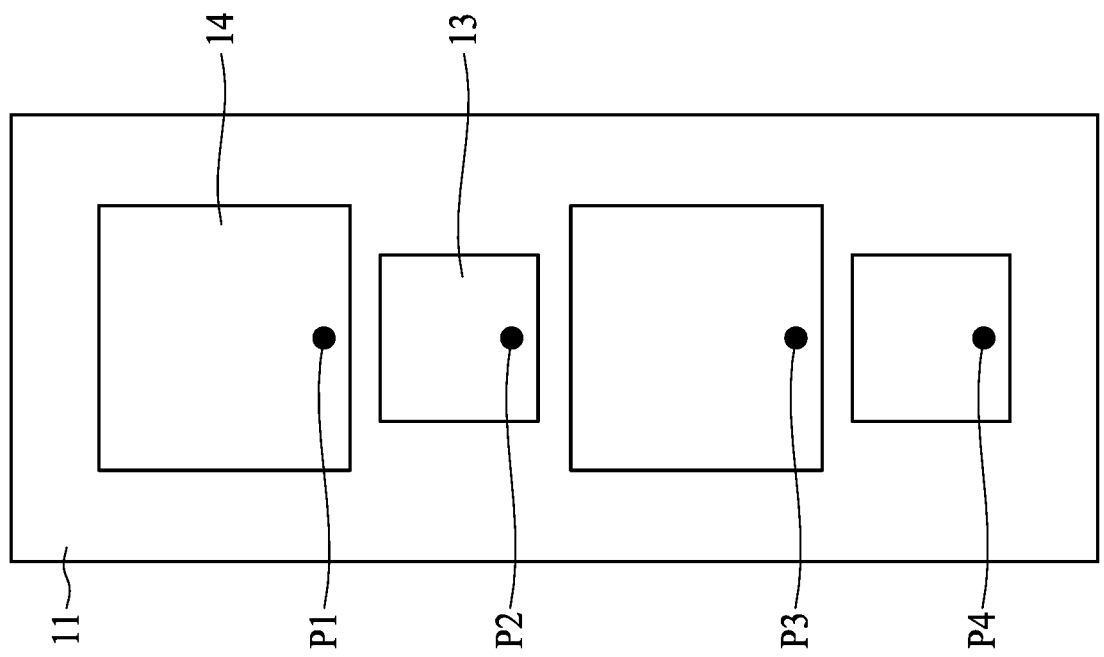
FIG. 1B illustrates a top view of a semiconductor device package in accordance with some embodiments of the present disclosure.

FIG. 1A illustrates a cross-sectional view of a semiconductor device package 1 in accordance with some embodiments of the present disclosure. FIG. 1B illustrates a top view of the semiconductor device package 1 illustrated in FIG. 1A in accordance with some embodiments of the present disclosure (for clarity, some of the components in FIG. 1A are omitted in FIG. 1B). The semiconductor device package 1 includes a substrate 10, a conductive layer 11, a dielectric layer 12 and antenna patterns 13 and 14.

The substrate 10 may be, for example, a printed circuit board, such as a paper-based copper foil laminate, a composite copper foil laminate, or a polymer-impregnated glass-fiber-based copper foil laminate. The substrate 10 may include an interconnection structure (or electrical connection), such as a redistribution layer (RDL) or a grounding element. The substrate 10 has a surface 101 and a surface 102 opposite to the surface 101. In some embodiments, one or more electronic components (not shown in the drawing) are disposed on the surface 102 of the substrate 10 and electrically connected to the substrate 10. In some embodiments, the electronic components may be active electronic components, such as integrated circuit (IC) chips or dies. The electronic components may be electrically connected to the substrate 10 (e.g., to the RDL) by way of flip-chip or wire-bond techniques.

A conductive layer 11 is disposed on the surface 101 of the substrate 10. In some embodiments, the conductive layer 11 is formed of or includes gold (Au), silver (Ag), aluminum (Al), copper (Cu), or an alloy thereof. In some embodiments, the conductive layer 11 acts as a ground layer or a RF layer for the antenna pattern 13 or 14.

The dielectric layer 12 is disposed on the conductive layer 11. In some embodiments, the dielectric layer 12 is used to increase a distance (e.g., a clearance area) between the antenna pattern 13 or 14 and the conductive layer 10a (e.g., ground plane or RF layer), which would improve the performance of the antenna pattern 13 or 14. In some embodiments, there may be any number of the dielectric layers depending on different specifications. The dielectric layer 12 has a surface 121 and a surface 122 opposite to the surface 121.

In some embodiments, the dielectric layer 12 may include molding compounds, pre-impregnated composite fibers (e.g., pre-preg), Borophosphosilicate Glass (BPSG), silicon oxide, silicon nitride, silicon oxynitride, Undoped Silicate Glass (USG), any combination thereof, or the like. Examples of molding compounds may include, but are not limited to, an epoxy resin including fillers dispersed therein. Examples of a pre-preg may include, but are not limited to, a multi-layer structure formed by stacking or laminating a number of pre-impregnated materials/sheets. In some embodiments, a dielectric constant (Dk) of the dielectric layer 12 is about 3.63.

The antenna patterns 13 and 14 are disposed on the surface 121 of the dielectric layer 12. In some embodiments, as shown in FIG. 1A, the antenna pattern 13 includes a feeding port 13*f* electrically connected to the conductive layer 11 to transmit or receive signal from the conductive layer 11. The antenna pattern 14 includes a feeding port 14*f* electrically connected to the conductive layer 11 to transmit or receive signal from the conductive layer 11. In other embodiments, the signal transmission between the antenna pattern 13 (or antenna pattern 14) and the conductive layer 11 may be achieved by coupling. In some embodiments, the antenna pattern 13 or 14 is, or includes, a conductive material such as a metal or metal alloy. Examples of the conductive material include Au, Ag, Al, Cu, or an alloy thereof.

In some embodiments, the antenna pattern 13 or 14 may include a single antenna element. In some embodiments, the antenna pattern 13 or 14 may include multiple antenna elements. For example, the antenna pattern 13 or 14 may include an array including patch antennas. In some embodiments, the antenna pattern 13 or 14 may include an M×N array of antenna elements, where M or N is an integer greater than 1. In some embodiments, M can be the same as or different from N depending on design specifications. For example, as shown in FIG. 1B, the antenna pattern 13 may include a 1×2 array of antenna elements, and the antenna pattern 14 may include a 1×2 array of antenna elements. The antenna patterns 13 and 14 are alternatingly arranged. For example, there is one antennae element of the antenna pattern 13 disposed between two adjacent antenna elements of the antenna patterns 14, and vice versa. In some embodiments, the antenna pattern 13 is or includes a patch antenna or a patch antenna array operating in a frequency of 38 GHz. For example, a bandwidth of the antenna pattern 13 is in a range from about 37 GHz to about 42.5 GHz. In some embodiments, the antenna pattern 14 is or includes a patch antenna or a patch antenna array operating in a frequency of 28 GHz. For example, a bandwidth of the antenna pattern 14 is in a range from about 24.75 GHz to about 27.5 GHz.

In accordance with the embodiments in FIGS. 1A and 1B, the semiconductor device package 1 is a dual-band antenna module having two antenna patterns (e.g., the antenna pattern 13 and 14) with different operating bandwidths, which can increase a bandwidth and a stability of the transmission rate of the semiconductor device package 1.

Figure 2A:
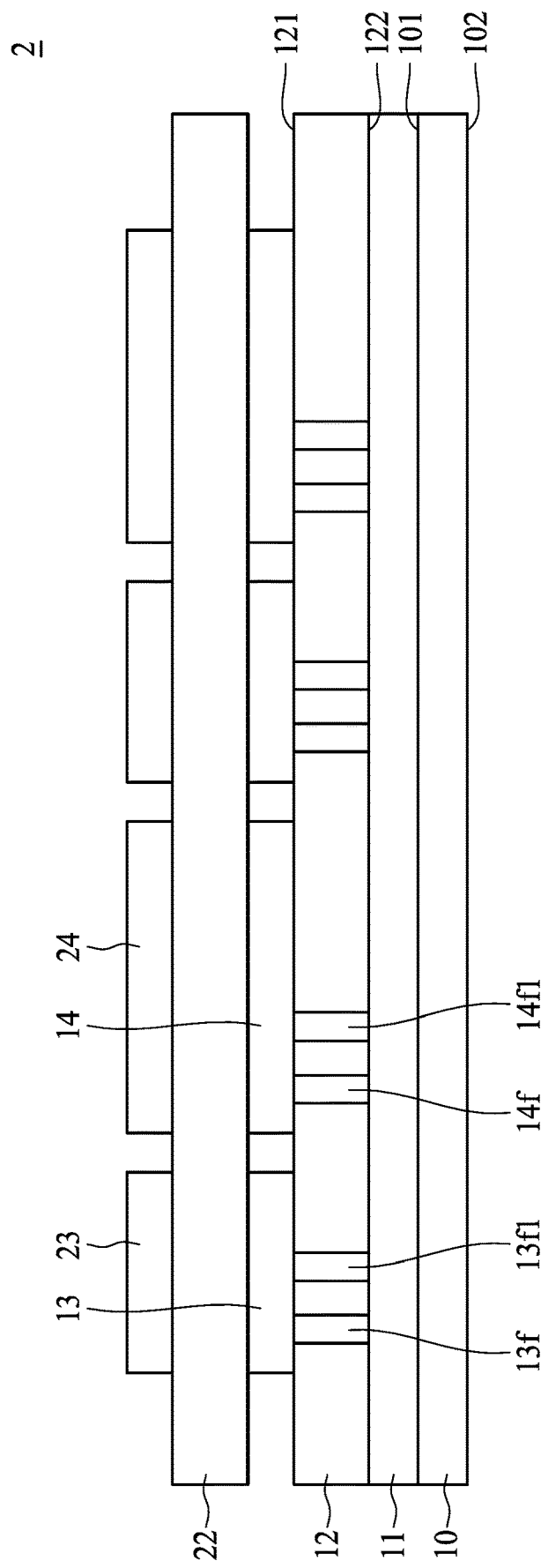
FIG. 2A illustrates a cross-sectional view of a semiconductor device package in accordance with some embodiments of the present disclosure.
Figure 2B:
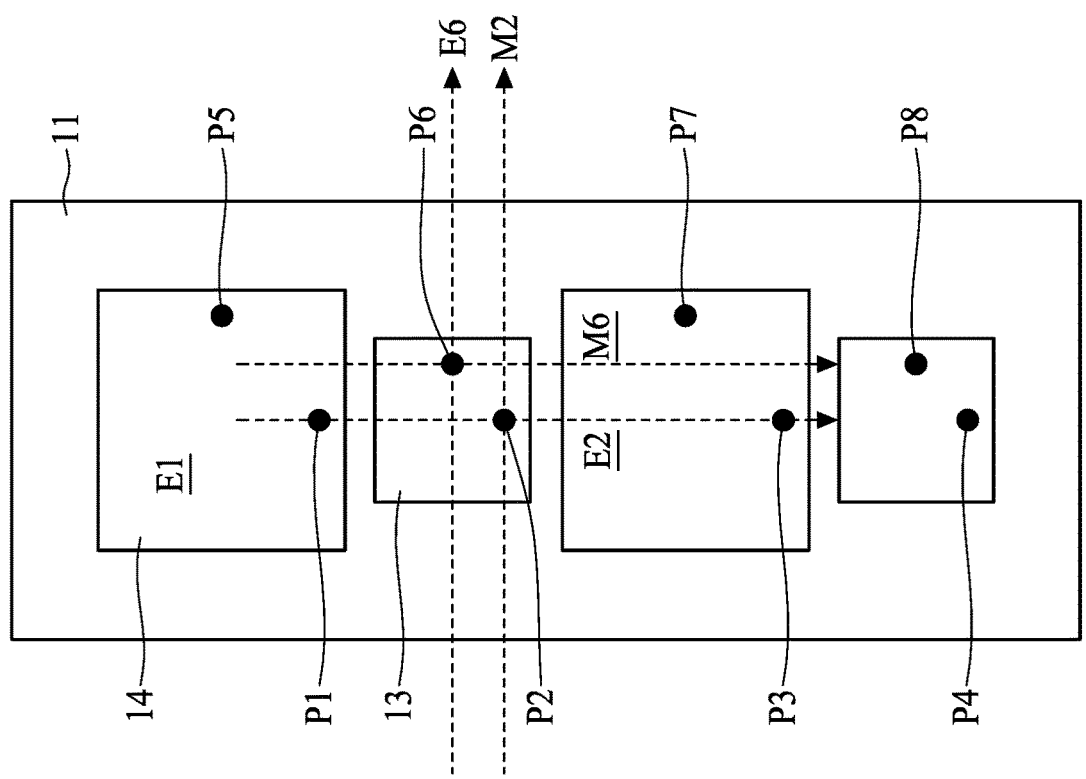
FIG. 2B illustrates a top view of a semiconductor device package in accordance with some embodiments of the present disclosure.

FIG. 2A illustrates a cross-sectional view of a semiconductor device package 2 in accordance with some embodiments of the present disclosure. FIG. 2B illustrates a top view of the semiconductor device package 2 illustrated in FIG. 2A in accordance with some embodiments of the present disclosure (for clarity, some of the components (e.g., the dielectric layers 12, 22 and the antenna patterns 23 and 24) are omitted in FIG. 2B). The semiconductor device package 2 is similar to the semiconductor device package 1 as shown in FIG. 1A, and the differences therebetween are described below.

Each antenna element of the antenna patterns 13 and 14 of the semiconductor device package 1 has a single polarization, while each antenna element of the antenna patterns 13 and 14 of the semiconductor device package 2 has dual polarizations. For example, as shown in FIG. 1B, each antenna element of the antenna patterns 13 has one polarized port (e.g., p2 or p4) and each antenna element of the antenna patterns 14 has one polarized port (e.g., p1 or p3). As shown in FIG. 2B, each antenna element of the antenna patterns 13 has a pair of polarized ports (e.g., "p2 and p6" or "p4 and p8") and each antenna element of the antenna patterns 14 has a pair of polarized ports (e.g., "p1 and p5" or "p3 and p'7"). In some embodiments, as shown in FIG. 2A, the antenna pattern 13 includes feeding ports 13*f* and 13*f*1 electrically connected to the conductive layer 11 to transmit or receive signal from the conductive layer 11. The antenna pattern 14 includes feeding ports 14*f* and 14*f*1 electrically connected to the conductive layer 11 to transmit or receive signal from the conductive layer 11. In other embodiments, the signal transmission between the antenna pattern 13 (or antenna pattern 14) and the conductive layer 11 may be achieved by coupling. In other embodiments, each antenna element of the antenna patterns 13 and 14 of the semiconductor device package 2 may have a single polarization.

The semiconductor device package 2 further includes a stacked antenna patterns 23 and 24 on the antenna patterns 13 and 14. For example, as shown in FIG. 2A, the semiconductor device package 2 includes a dielectric layer 22 disposed on the antenna patterns 13 and 14. In some embodiments, the dielectric layer 22 is the same as or similar to the dielectric layer 12, and the properties and descriptions of the dielectric layer 12 can be applicable to the dielectric layer 22. The antenna patterns 23 and 24 are disposed on the dielectric layer 22. The antenna pattern 23 is arranged corresponding to the antenna pattern 13. For example, the antenna pattern 23 is substantially aligned with the antenna pattern 13. For example, the antenna patterns 13 and 23 are substantially fully overlapping in a direction perpendicular to the surface 121 of the dielectric layer 12. The antenna pattern 23 is magnetically coupled with the antenna pattern 13 for signal transmission. The antenna pattern 24 is arranged corresponding to the antenna pattern 14. For example, the antenna pattern 24 is substantially aligned with the antenna pattern 14. For example, the antenna patterns 14 and 24 are substantially fully overlapping in a direction perpendicular to the surface 121 of the dielectric layer 12. The antenna pattern 24 is magnetically coupled with the antenna pattern 14 for signal transmission. In some embodiments, the antenna patterns 23 and 24 are respectively the same as or similar to the antenna patterns 13 and 14, and the properties and the descriptions of the antenna patterns 13 and 14 are applicable to the antenna patterns 23 and 24.

Compared with the antenna pattern 13 or 14 of the semiconductor device package 1, which has a single polarized port, the antenna pattern 13 or 14 of the semiconductor device package 2, which has dual polarized ports, has a broader bandwidth and stable transmission rate. In addition, stacking two set of antenna patterns (e.g., stacking the antenna patterns 23 and 24 over the antenna patterns 13 and 14) with the same or similar bandwidth, the bandwidth of the semiconductor device package 2 can further increase.

As shown in FIG. 2B, the port p2 of the antenna element of the antenna pattern 13 would generate two polarized radiations/waves, such as a magnetic field M2 and an electric field E2 (the magnetic field M2 and the electric field E2 are orthogonal), and the port p6 of the antenna element of the antenna pattern 13 would generate two polarized radiations/waves, such as a magnetic field M6 and an electric field E6 (the magnetic field M6 and the electric field E6 are orthogonal). The polarized wave/radiation (e.g., magnetic field M6 and/or electric field E2) emitted by the antenna pattern 13 would pass through the antenna pattern 14, which would adversely affect the performance of the antenna pattern 13, and vice versa.

Figure 2C:
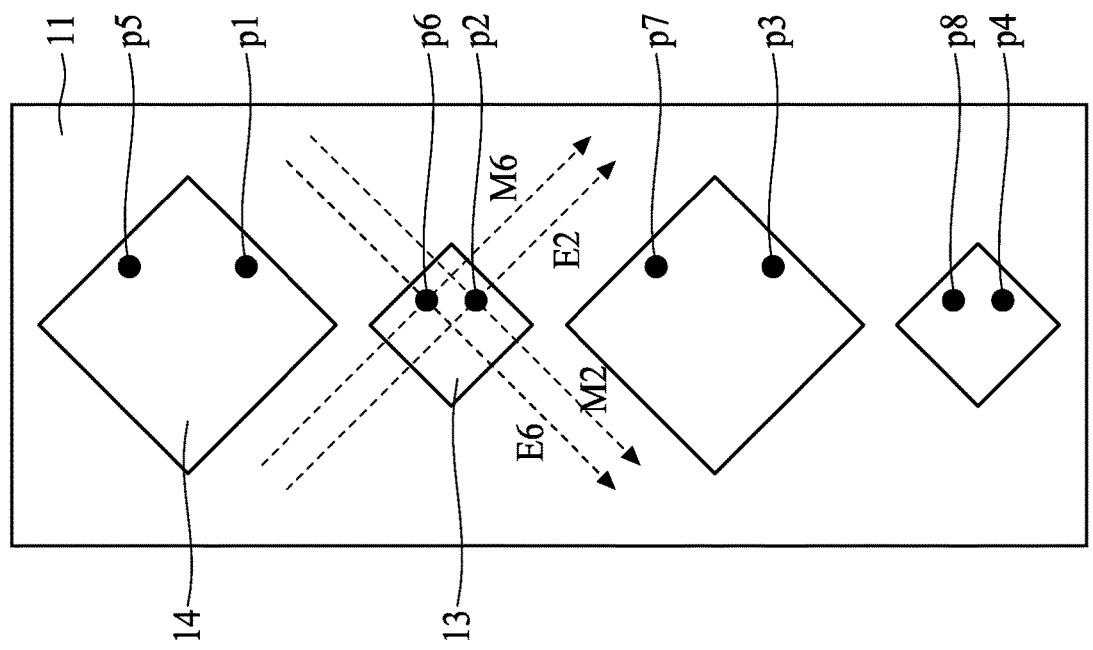
FIG. 2C illustrates a top view of a semiconductor device package in accordance with some embodiments of the present disclosure.

FIG. 2C illustrates a top view of the semiconductor device package 2 as shown in FIG. 2A in accordance with some embodiments of the present disclosure (for clarity, some of the components (e.g., the dielectric layers 12, 22 and the antenna patterns 23 and 24) are omitted in FIG. 2C). In other embodiments, the structure illustrated in FIG. 2C may be a top view of the semiconductor device package 1 as shown in FIG. 1A. The structure illustrated in FIG. 2C is similar to that in FIG. 2B, except that in FIG. 2C, each antenna element of the antenna patterns 13 and 14 (and antenna patterns 23 and 24) rotate counterclockwise by 45°. For example, a prolonged line of any edge of the antenna element of the antenna patterns 13 and 14 would not be either perpendicular or parallel to a prolonged line of any edge of the surface 101 of the substrate 10 (or the surface 121 of the dielectric layer 12). For example, a prolonged line of an edge of the antenna pattern 13 parallel to the magnetic field M2 (or M6) generated by the port p2 (or p6) of the antenna pattern 13 is spaced apart from the antenna pattern 14. For example, a prolonged line of an edge of the antenna pattern 13 parallel to the magnetic field M2 (or M6) generated by the port p2 (or p6) of the antenna pattern 13 does not pass through the antenna pattern 14. For example, a projection of a lateral surface of the antenna pattern 13 adjacent to the port p2 (or p6) is spaced apart from the antenna pattern 14. For example, a projection of a lateral surface of the antenna pattern 13 adjacent to the port p2 (or p6) does not pass through the antenna pattern 14.

As shown in FIG. 2C, all the polarized radiations E2, E6, M2 and M6 generated by the antenna element of the antenna pattern 13 would not pass through either the antenna pattern having different bandwidths (e.g., the antenna pattern 14) or the antenna pattern having the same bandwidth (e.g., other antenna elements of the antenna pattern 13), and thus the interference between the antenna patterns 13 and 14 can be eliminated or reduced. This would increase the gain of the antenna patterns 13 and 14, and improve the performance of the antenna patterns 13 and 14.

In some embodiments, the antenna patterns 13 and 14 have different phases. For example, the antenna pattern 13 may delay (or lead) the antenna pattern 14 by a phase $\varphi$, where $\varphi$ is greater than 0° and less than 180°. In some embodiments, the antenna pattern 14 leads the antenna pattern 13 by a phase 60°. Because of the phase difference of the antenna patterns 13 and 14, the interference between the antenna patterns 13 and 14 can be further reduced, which can increase the gain of the antenna patterns 13 and 14.

Figure 3:
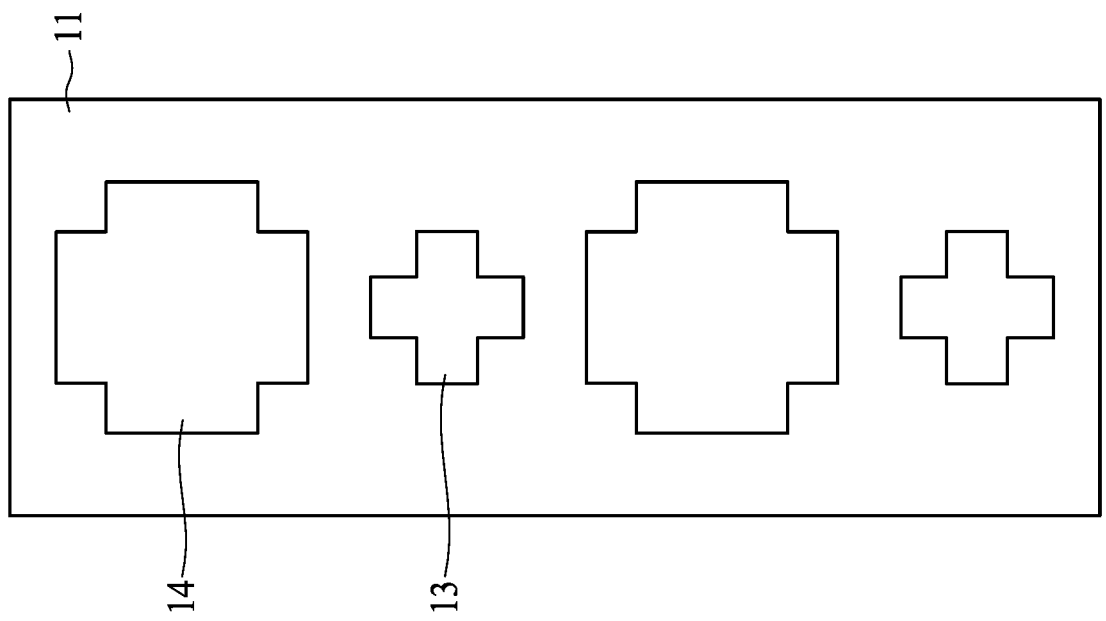
FIG. 3 illustrates a top view of a semiconductor device package in accordance with some embodiments of the present disclosure.
Figure 4:
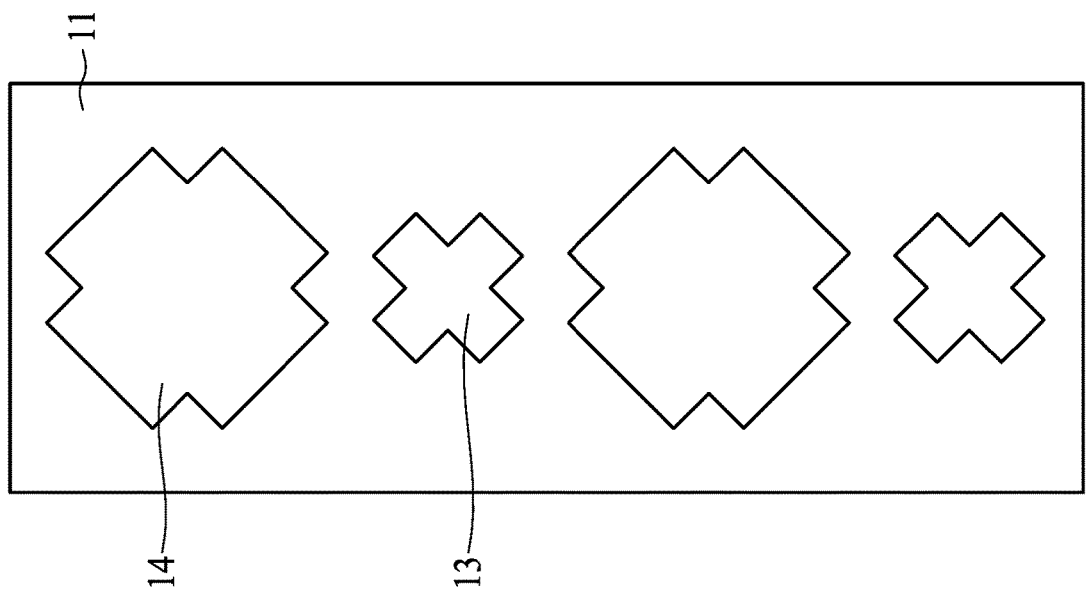
FIG. 4 illustrates a top view of a semiconductor device package in accordance with some embodiments of the present disclosure.
Figure 5:
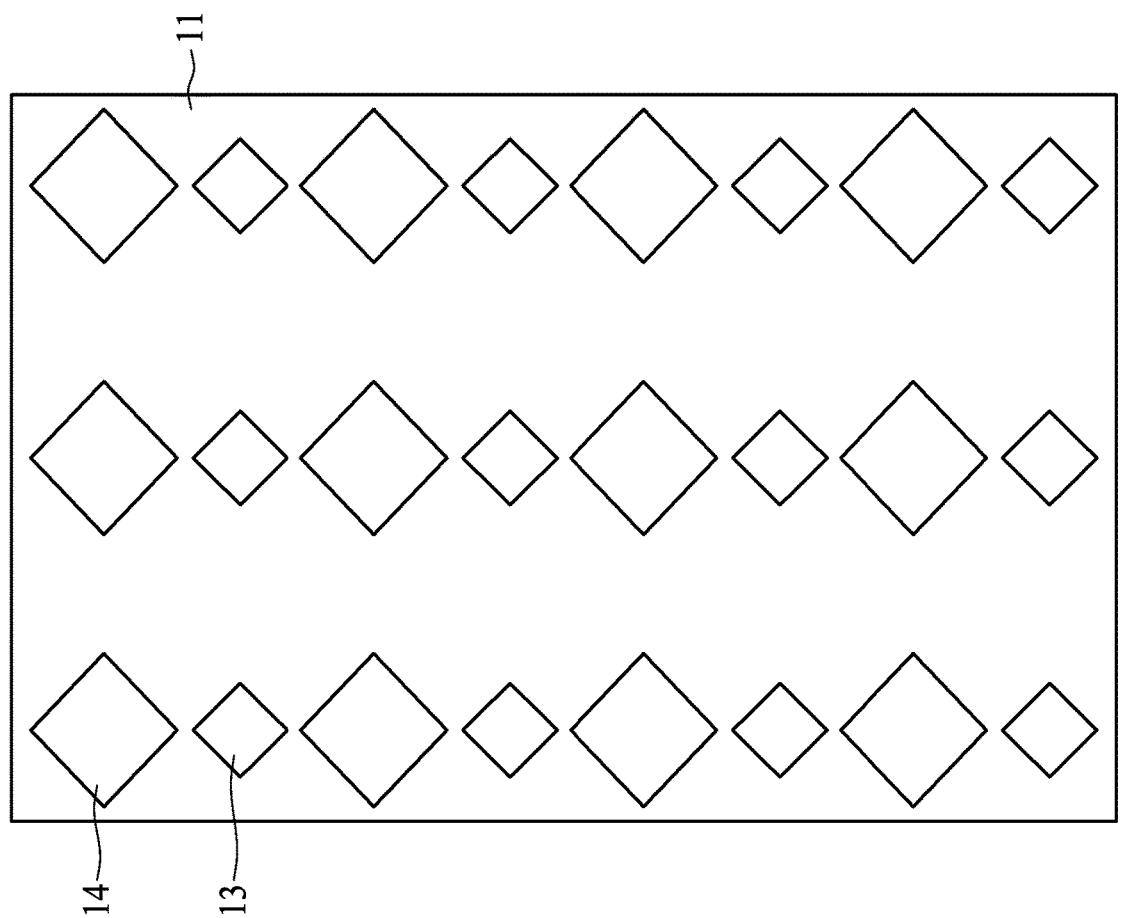
FIG. 5 illustrates a top view of a semiconductor device package in accordance with some embodiments of the present disclosure.

In some embodiments, the antenna pattern 13 or 14 may have different shapes. For example, as shown in FIGS. 1B and 2B, each antenna element of the antenna pattern 13 or 14 is rectangular. For example, as shown in FIGS. 2C and 5, each antenna element of the antenna pattern 13 or 14 may be shaped like a rhombus. For example, as shown in FIG. 3, each antenna element of the antenna pattern 13 or 14 may be shaped like a cross. For example, as shown in FIG. 4, each antenna element of the antenna pattern 13 or 14 may be shaped like an "X". The shapes of the antenna patterns 13 and 14 can be changed or adjusted depending on different design specifications. For example, the antenna patterns 13 and 14 can be shaped like a polygon having N edges (or sides), where N is an integer equal to or greater than 3.

In some embodiments, the antenna pattern 13 or 14 (and the antenna pattern 23 or 24) may include any number of antenna elements arranged alternatingly. For example, the antenna pattern 13 or 14 may include an M×N array of antenna elements, where M or N is an integer greater than 1. In some embodiments, M can be the same as or different from N depending on design specifications. For example, as shown in FIG. 2B, 2C, 3 or 4, the antenna pattern 13 may include a 1×2 array of antenna elements, and the antenna pattern 14 may include a 1×2 array of antenna elements. For example, as shown in FIG. 5, the antenna pattern 13 may include a 3×4 array of antenna elements, and the antenna pattern 14 may include a 3×4 array of antenna elements.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
a substrate having a first surface and a second surface opposite to the first surface;
a first antenna pattern disposed over the first surface of the substrate, the first antenna pattern having a first bandwidth, the first antenna pattern having a first port configured to generate a magnetic field; and
a second antenna pattern disposed over the first surface of the substrate, the second antenna pattern having a second bandwidth different from the first bandwidth,
wherein a prolonged line of an edge of the first antenna pattern parallel to the magnetic field generated by the first port of the first antenna pattern is spaced apart from the second antenna pattern.

2. The semiconductor device package of claim 1, wherein the first antenna pattern and the second antenna pattern are alternatingly arranged.

3. The semiconductor device package of claim 1, wherein the first surface of the substrate has an edge;
the prolonged line of the edge of the first antenna pattern and the prolonged line of the edge of the first surface of the substrate define an angle; and
the angle is greater than 0° and less than 90°.

4. The semiconductor device package of claim 1, wherein the second antenna pattern has a first port configured to generate a magnetic field; and
a prolonged line of an edge of the second antenna pattern parallel to the magnetic field generated by the first port of the second antenna pattern is substantially parallel to the prolonged line of the edge of the first antenna pattern.

5. The semiconductor device package of claim 1, further comprising a conductive layer disposed on the first surface of the substrate and electrically connected to the first antenna pattern and the second antenna pattern.

6. The semiconductor device package of claim 5, wherein the conductive layer is a ground layer or a radio frequency (RF) layer.

7. The semiconductor device package of claim 5, further comprising a first dielectric layer disposed on the conductive layer and a conductive via within the first dielectric layer, wherein the conductive via electrically connects the first antenna pattern or the second antenna pattern with the conductive layer.

8. The semiconductor device package of claim 1, further comprising:
a second dielectric layer disposed on the first antenna pattern and the second antenna pattern;
a third antenna pattern disposed on the second dielectric layer; and
a fourth antenna pattern disposed on the second dielectric layer,
wherein the third antenna pattern has the first bandwidth, and the fourth antenna pattern has the second bandwidth.

9. The semiconductor device package of claim 8, wherein the third antenna pattern is substantially aligned with the first antenna pattern in a direction perpendicular to the first surface of the substrate; and
the fourth antenna pattern is substantially aligned with the second antenna pattern in a direction perpendicular to the first surface of the substrate.

10. The semiconductor device package of claim 1, wherein each of the first antenna pattern and the second antenna pattern includes an M×N array of antenna elements, where M or N is an integer greater than 1.

11. The semiconductor device package of claim 10, wherein each antenna element of the first antenna pattern and the second antenna pattern is shaped like a rectangle, a rhombus or a cross.

12. The semiconductor device package of claim 1, further comprising an electronic component disposed on the second surface of the substrate and electrically connected to the first antenna pattern and/or the second antenna pattern.

13. The semiconductor device package of claim 1, wherein the first antenna pattern and the second antenna pattern are arranged on a same plane.

14. A semiconductor device package, comprising:
a substrate having a first surface and a second surface opposite to the first surface;
a first antenna disposed over the first surface of the substrate; and
a second antenna disposed over the first surface of the substrate,
wherein the first antenna and the second antenna are arranged on a same plane, and
wherein a range of operating frequency of the first antenna is different from a range of operating frequency of the second antenna.

15. The semiconductor device package of claim 14, wherein a bandwidth of a wave generated by the first antenna is different from a bandwidth of a wave generated by the second antenna.

16. The semiconductor device package of claim 14, wherein the first antenna and the second antenna are alternatingly arranged.

17. The semiconductor device package of claim 14, wherein
the second antenna has a first port configured to generate a magnetic field; and a lateral surface of the second antenna adjacent to the first port is substantially coplanar with the lateral surface of the first antenna.

18. The semiconductor device package of claim 14, further comprising a conductive layer disposed on the first surface of the substrate and electrically connected to the first antenna and the second antenna.

19. The semiconductor device package of claim 18, wherein the conductive layer is a ground layer or a radio frequency (RF) layer.

20. The semiconductor device package of claim 18, further comprising a first dielectric layer disposed on the conductive layer and a conductive via within the first dielectric layer, wherein the conductive via electrically connects the first antenna or the second antenna with the conductive layer.

21. The semiconductor device package of claim 14, further comprising:
   a second dielectric layer disposed on the first antenna pattern and the second antenna;
   a third antenna disposed on the second dielectric layer; and
   a fourth antenna disposed on the second dielectric layer, wherein the third antenna has the first bandwidth, and the fourth antenna has the second bandwidth.

22. The semiconductor device package of claim 21, wherein
   the third antenna is substantially aligned with the first antenna in a direction perpendicular to the first surface of the substrate; and
   the fourth antenna pattern is substantially aligned with the second antenna in a direction perpendicular to the first surface of the substrate.

23. The semiconductor device package of claim 14, further comprising an electronic component disposed on the second surface of the substrate and electrically connected to the first antenna and/or the second antenna.

24. The semiconductor device package of claim 14, wherein the first antenna is different from the second antenna in size.

25. The semiconductor device package of claim 14, wherein a prolonged line of an edge of the first antenna is spaced part from the second antenna.

26. The semiconductor device package of claim 14, wherein the first antenna has a first port configured to generate a magnetic field, and wherein a projection of a lateral surface of the first antenna adjacent to the first port is spaced apart from the second antenna.

27. The semiconductor device package of claim 16, wherein the first antenna has a first port configured to generate a magnetic field, and wherein a projection of a lateral surface of the first antenna adjacent to the first port is spaced apart from the second antenna.

28. A semiconductor device package, comprising:
   a substrate having a first surface and a second surface opposite to the first surface;
   a first antenna disposed over the first surface of the substrate, the first antenna having a first port configured to generate a magnetic field; and
   a second antenna disposed over the first surface of the substrate,
   wherein the first antenna and the second antenna are arranged on a same plane;
   wherein a projection of a lateral surface of the first antenna adjacent to the first port is spaced apart from the second antenna, and
   wherein a bandwidth of a wave generated by the first antenna is different from a bandwidth of a wave generated by the second antenna.

* * * * *